(12) United States Patent
Wang et al.

(10) Patent No.: US 11,051,428 B2
(45) Date of Patent: Jun. 29, 2021

(54) OSCILLATING HEAT PIPE INTEGRATED THERMAL MANAGEMENT SYSTEM FOR POWER ELECTRONICS

(71) Applicant: Hamilton Sundstrand Corporation, Charlotte, NC (US)

(72) Inventors: Jinliang Wang, Ellington, CT (US); Suman Dwari, Vernon, CT (US)

(73) Assignee: HAMILTON SUNSTRAND CORPORATION, Charlotte, NC (US)

(*) Notice: Subject to any disclaimer, the term of this patent is extended or adjusted under 35 U.S.C. 154(b) by 0 days.

(21) Appl. No.: 16/670,043

(22) Filed: Oct. 31, 2019

(65) Prior Publication Data
US 2021/0136954 A1 May 6, 2021

(51) Int. Cl.
*H05K 7/20* (2006.01)
*F28F 13/10* (2006.01)
*H01L 23/427* (2006.01)
*H01L 25/07* (2006.01)

(52) U.S. Cl.
CPC ........ *H05K 7/20336* (2013.01); *F28F 13/10* (2013.01); *H01L 23/427* (2013.01); *H01L 25/072* (2013.01); *H05K 7/20327* (2013.01); *H05K 7/20936* (2013.01)

(58) Field of Classification Search
CPC . H01L 23/427; H01L 25/072; H05K 7/20336; H05K 7/20327; H05K 7/20254; H05K 7/20509; H05K 7/20663; H05K 7/20936; F28F 13/10
See application file for complete search history.

(56) References Cited

U.S. PATENT DOCUMENTS

| 6,031,751 A | * | 2/2000 | Janko ............ F28F 13/00 363/144 |
|---|---|---|---|
| 7,755,894 B2 | | 7/2010 | Yang et al. |
| 9,730,365 B2 | | 8/2017 | Mari Curbelo et al. |
| 9,750,160 B2 | | 8/2017 | Short, Jr. et al. |
| 10,383,261 B2 | | 8/2019 | Krivonak et al. |
| 2006/0144567 A1 | | 7/2006 | Zhu et al. |
| 2007/0175616 A1 | * | 8/2007 | Li ............ H01L 23/427 165/104.33 |

(Continued)

FOREIGN PATENT DOCUMENTS

CN 102628655 A 8/2012

OTHER PUBLICATIONS

EP Search Report; Application No. 20191734.1-1002; dated Mar. 24, 2021; 20 pages.

*Primary Examiner* — Jacob R Crum
(74) *Attorney, Agent, or Firm* — Cantor Colburn LLP

(57) ABSTRACT

Disclosed is a thermal management system for removing heat from a power electronic heat source, the system comprising: a base plate having a plurality of fluid passages there through and extending between and inlet side of the base plate and an outlet side of the base plate; and a plurality of heat transfer pipe segments respectively attached to one or more of the plurality of fluid passages at the inlet side of the base plate and the outlet side of the base plate, the plurality of heat transfer pipe segments arranged adjacent one another, the plurality of heat transfer pipe segments containing a two-phase working fluid, and the plurality of heat transfer pipe segments forming a continuous flow path through and back into the base plate for the two-phase working fluid.

16 Claims, 5 Drawing Sheets

(56) References Cited

U.S. PATENT DOCUMENTS

| | | | |
|---|---|---|---|
| 2008/0087406 A1 | 4/2008 | Asfia et al. | |
| 2008/0117637 A1 | 5/2008 | Chang et al. | |
| 2008/0266801 A1 | 10/2008 | Weiss et al. | |
| 2009/0095448 A1 | 4/2009 | Lai et al. | |
| 2013/0008633 A1* | 1/2013 | Gradinger | F28D 15/0266 165/104.34 |
| 2013/0104592 A1* | 5/2013 | Cottet | F28D 15/0266 62/419 |
| 2013/0107455 A1* | 5/2013 | Cottet | H05K 7/20936 361/694 |
| 2013/0206369 A1* | 8/2013 | Lin | F28D 15/043 165/104.26 |
| 2015/0000871 A1 | 1/2015 | Farner et al. | |
| 2016/0097601 A1 | 4/2016 | Jalbert et al. | |
| 2018/0158756 A1 | 6/2018 | Smoot et al. | |
| 2018/0187978 A1 | 7/2018 | Herring et al. | |
| 2019/0154352 A1* | 5/2019 | Lin | F28D 15/0266 |
| 2020/0183469 A1* | 6/2020 | Wang | F28D 15/0275 |

\* cited by examiner

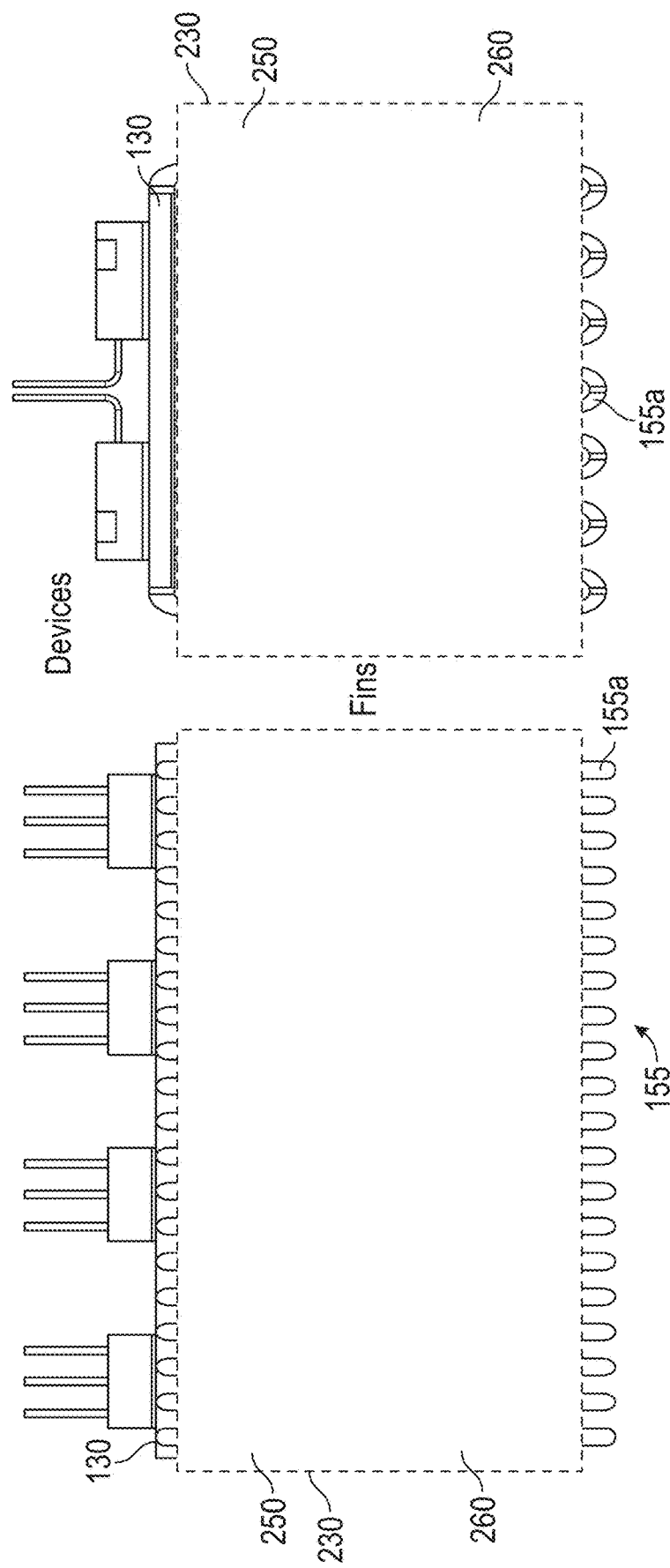

OSCILLATING HEAT PIPE INTEGRATED THERMAL MANAGEMENT SYSTEM FOR POWER ELECTRONICS

STATEMENT OF FEDERAL SUPPORT

This invention was made with government support under DE-AR0000889 awarded by the U.S. Department of Energy. The government has certain rights in the invention.

BACKGROUND

The embodiments herein relate to systems for cooling of electronic components and more specifically to an oscillating heat pipe integrated thermal management system for power electronics.

Power electronic devices and modules are used in a wide range of applications. For example, in electric motor controllers, switches and diodes are employed to define rectifiers, inverters, and more generally, power converters. In a typical inverter, for example, incoming single or three-phase AC power is converted to DC power, and power electronic switches, such as insolated gate bipolar transistors (IGBTs) are switched to generate an output waveform from the DC power that is applied to drive a motor. Such inverter drives are particularly useful insomuch as the speed of a driven motor is a function of the frequency of the output waveform. Other similar devices may modify AC power and DC power, convert DC power to AC power and vice versa, and so forth. Other power electronic devices incorporated in such circuits may include silicon controlled rectifiers (SCRs), as examples.

Depending upon the size and rating of the circuits and components used in the power electronic circuits, a plurality of components are typically disposed on a common support or substrate to form a module. A continuing issue in such components is the management of heat that is generated by the components. In general, generated heat must be removed to protect the components from damage and to extend their useful life.

SUMMARY OF THE DISCLOSED EMBODIMENTS

Disclosed is a thermal management system for removing heat from a power electronic heat source, the system comprising: a base plate having a plurality of fluid passages there through and extending between and inlet side of the base plate and an outlet side of the base plate; and a plurality of heat transfer pipe segments respectively attached to one or more of the plurality of fluid passages at the inlet side of the base plate and the outlet side of the base plate, the plurality of heat transfer pipe segments arranged adjacent one another, the plurality of heat transfer pipe segments containing a two-phase working fluid, and the plurality of heat transfer pipe segments forming a continuous flow path through and back into the base plate for the two-phase working fluid.

In addition to one or more of the above disclosed aspects or as an alternate the plurality of fluid passages in the base plate are parallel one another.

In addition to one or more of the above disclosed aspects or as an alternate the plurality of heat transfer pipe segments extend perpendicularly to the base plate.

In addition to one or more of the above disclosed aspects or as an alternate each of the plurality of heat transfer pipe segments forms a closed-loop.

In addition to one or more of the above disclosed aspects or as an alternate at least two of the plurality of heat transfer pipe segments are fluidly connected to form a closed-loop.

In addition to one or more of the above disclosed aspects or as an alternate all of the plurality of heat transfer pipe segments are fluidly connected to form a closed-loop.

In addition to one or more of the above disclosed aspects or as an alternate the two-phase working fluid is one of water, alcohol, methanol, or ammonia.

In addition to one or more of the above disclosed aspects or as an alternate the plurality of heat transfer pipe segments have a diameter of between 1-4 mm.

In addition to one or more of the above disclosed aspects or as an alternate the base plate is copper, or aluminum, or titanium, or their alloys.

In addition to one or more of the above disclosed aspects or as an alternate, the system includes a plurality of plate fins extending between the plurality of heat transfer pipe segments.

In addition to one or more of the above disclosed aspects or as an alternate, the system includes a porous media extending between the plurality of heat transfer pipe segments.

In addition to one or more of the above disclosed aspects or as an alternate the plurality of heat transfer pipe segments form respective serpentine channels.

In addition to one or more of the above disclosed aspects or as an alternate when transferring heat, the two-phase working fluid defines alternating liquid slugs and vapor bubbles that oscillate inside the plurality of heat transfer pipe segments, thereby forming oscillating heat pipes (OHP).

In addition to one or more of the above disclosed aspects or as an alternate when transferring heat, one zone of the plurality of heat transfer pipe segments closest the base plate defines an evaporation zone of the oscillating heat pipe and another zone of the plurality of heat transfer pipe segments further from the base plate defines a condensation zone for the oscillating heat pipe.

Further disclosed is an assembly including a power electronic heat source and a system having one or more of the above disclosed aspects connected to the power electronic heat source.

In addition to one or more of the above disclosed aspects or as an alternate the power electronic heat source includes at least one electronic device connected to the base plate.

In addition to one or more of the above disclosed aspects or as an alternate, the assembly includes a plurality of electronic devices arranged in a grid pattern on the base plate.

In addition to one or more of the above disclosed aspects or as an alternate the at least one electronic device includes an IGBT chip or a MOSFET chip.

Further disclosed is a method of removing heat from a power electronic heat source comprising: distributing heat generated in the power electronic heat source into a base plate; transferring heat from the base plate into a two-phase fluid charged through a plurality of fluid passages in the base plate and a plurality of heat transfer pipe segments that are each connected to one or more of the plurality of fluid passages, the plurality of heat transfer pipe segments forming a continuous flow path through and back into the base plate for the two-phase working fluid; and releasing heat from the plurality of heat transfer pipe segments into an environment surrounding the plurality of heat transfer pipe segments.

In addition to one or more of the above disclosed aspects or as an alternate, the method includes releasing heat from the plurality of heat transfer pipe segments into the environment through one or more of: a plurality of plate fins extending between the plurality of heat transfer pipe segments; and porous media surrounding the plurality of heat transfer pipe segments.

BRIEF DESCRIPTION OF THE DRAWINGS

The present disclosure is illustrated by way of example and not limited in the accompanying figures in which like reference numerals indicate similar elements.

FIGS. 4a-4b show an embodiment of the thermal management system that includes a plurality of plate fins and/or porous media;

DETAILED DESCRIPTION

Aspects of the disclosed embodiments will now be addressed with reference to the figures. Aspects in any one figure is equally applicable to any other figure unless otherwise indicated. Aspects illustrated in the figures are for purposes of supporting the disclosure and are not in any way intended on limiting the scope of the disclosed embodiments. Any sequence of numbering in the figures is for reference purposes only.

Applications of high-density power electronics in aerospace and transportation industries require light weight and highly compact thermal management solutions. Challenges may result in implementing such solutions at a chip level for systems having relatively high heat flux in view of system weight and volume limitations. Heat flux at a chip or device level may typically reach hundreds of watts per square centimeter (>100 W/cm$^2$), and up to a thousand watts per square centimeter 1 kW/cm$^2$ and perhaps more in certain applications. The heat may be dissipated so that silicon-based chip junction temperatures may be kept under 125 degrees Celsius. Traditional thermal management and packaging of power electric devices usually include designs that are modular and include multiple layers of materials. Power electronic modules are typically mounted to relatively bulky aluminum alloy-based heat sinks. Thermal resistances of heat spreading materials, thermal interfaces between materials and air convection become dominated factors of thermal management subsystems and system designs when dissipated heat flux densities are relatively high.

Figure 1:
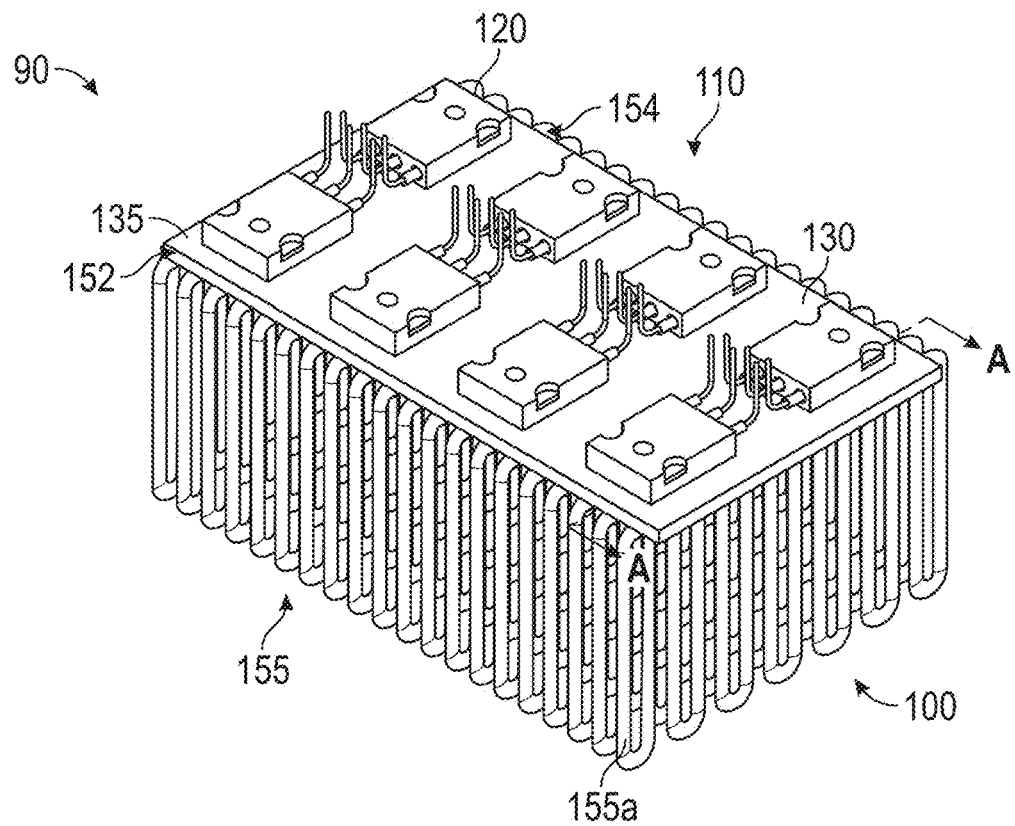
FIG. 1 is a schematic illustration of an assembly that includes a power electronics system connected to a thermal management system according to an embodiment.
Figure 2:
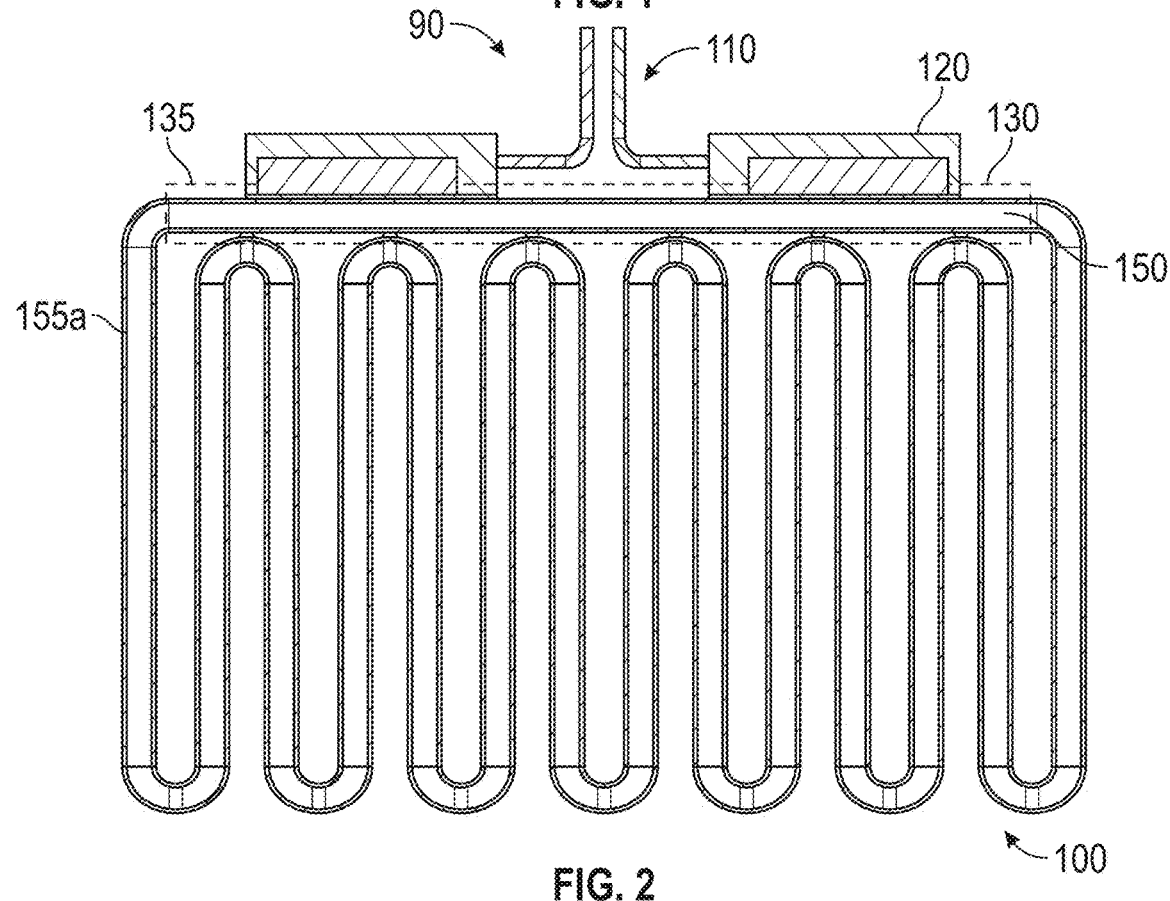
FIG. 2 is a sectional view, along section lines A-A of FIG. 1, of the assembly of FIG. 1, illustrating aspects including a heat transfer pipe segment of the thermal management system.
Figure 3:
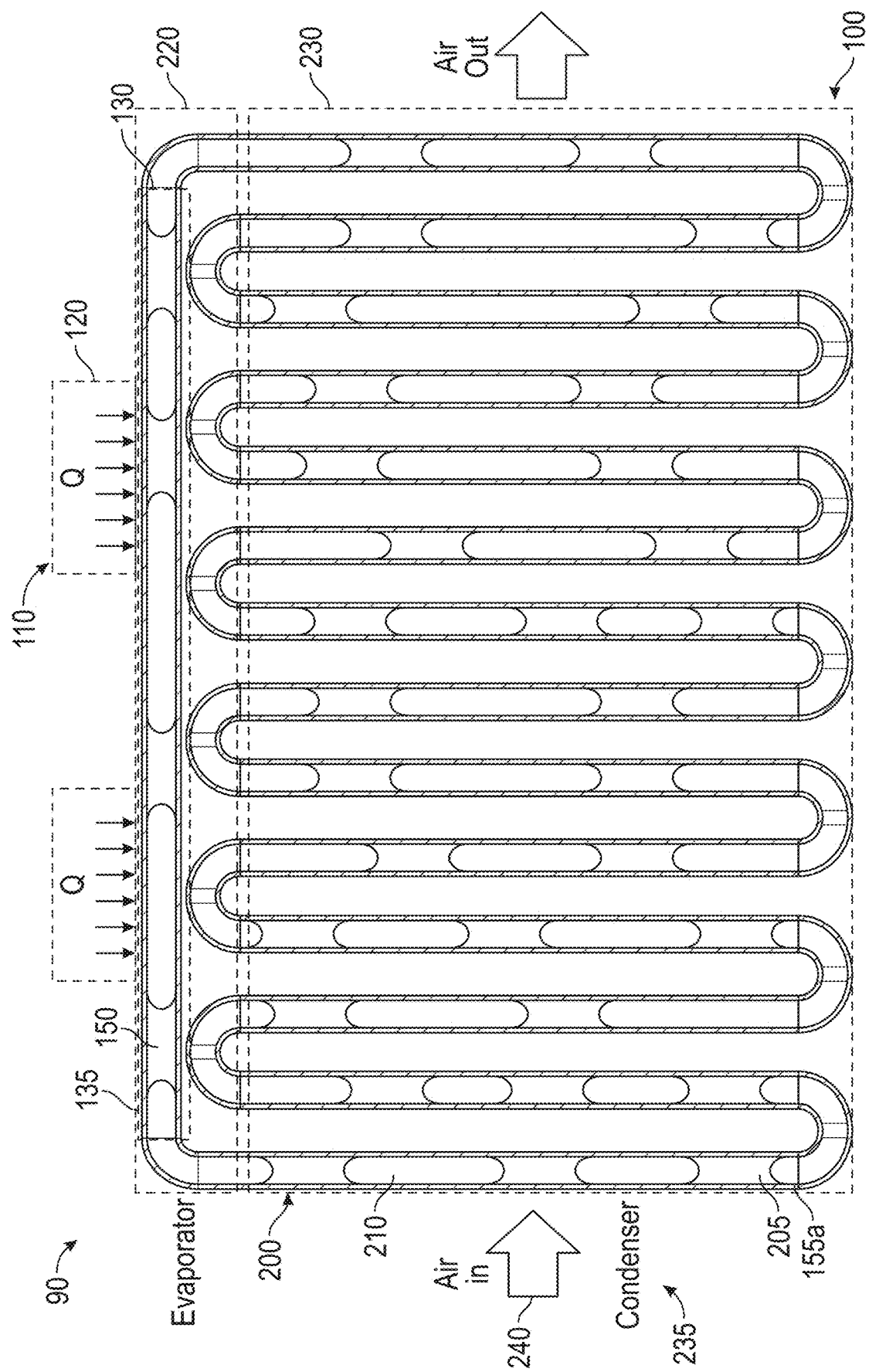
FIG. 3 shows liquid and vapor slugs within the plurality of heat transfer pipe segment illustrated in FIG. 2.

Turning to FIGS. 1-3, an assembly 90 is shown that includes a thermal management system (system) 100 used to convey heat away from at least one power electronic heat source 110. The system 100 reduces weight and volume while increasing thermal management performance for aerospace and transportation applications. The system 100 is mounted to or otherwise thermally coupled to the power electronic heat source 110. The power electronic heat source 110 can include at least one power electronic device (electronic device) 120. As illustrated, the power electronic heat source 110 includes a plurality of the electronic devices 120 organized in a grid pattern. The electronic device 120 can be, for example, an IGBT chip or a MOSFET chip and may include one or more diodes, molding compounds and other typical components. However, the power electronic heat source 110 can include any source of heat. The power electronic heat source 110 may be mounted, for example with electrical insulated thermal interface materials, onto a base layer or base plate 130 (illustrated schematically in FIGS. 2 and 3) of the system 100. The base plate 130 spreads heat generated by the power electronic heat source 110. In one embodiment, the base plate 130 is copper or aluminum, or alloys. As illustrated, the power electronic heat source 110 is mounted to one surface 135 of the base plate 130, which may be a top surface or a bottom surface depending on an orientation of the assembly 90.

The base plate 130 has a plurality of fluid passages 150 (FIG. 3) there through. The plurality of fluid passages 150 extend between and inlet side 152 (FIG. 2) of the base plate 130 and an outlet side 154 (FIG. 2) of the base plate 130. A plurality of heat transfer pipe segments 155 are respectively attached one or more of the fluid passages 150 at the inlet side 152 of the base plate 130 and the outlet side 154 of the base plate 130. In the figures one of the plurality of heat transfer pipe segments 155a is individually identified for reference. The plurality of heat transfer pipe segments 155 are arranged adjacent one another. The plurality of heat transfer pipe segments 155 contain a two-phase working fluid 200 (FIG. 3). In one embodiment, the two-phase working fluid 200 is one of water, alcohol, methanol, or ammonia.

In one embodiment the plurality of fluid passages 150 in the base plate 130 are parallel one another. In one embodiment the plurality of heat transfer pipe segments 155 extend perpendicularly to the base plate 130. In one embodiment the plurality of heat transfer pipe segments 155 define serpentine channels.

Turning to FIG. 3, the system 100 operates by capillary action within the plurality of heat transfer pipe segments 155. Specifically, capillary action is enabled by cohesion of two phase working fluid and adhesion between fluid and the plurality of heat transfer pipe segments 155. Adhesion of fluid to the plurality of heat transfer pipe segments 155 causes an upward force on the fluid at the walls and results in a meniscus which turns upward. Cohesion surface tension holds the fluid intact. Capillary action occurs when the adhesion to the walls of the plurality of heat transfer pipe segments 155 is stronger than the cohesive forces between the liquid molecules. Smaller diameter pipes for the plurality of heat transfer pipe segments 155 have more relative surface area. This allows capillary action to pull liquid higher than with larger diameter pipes. Thus, in the disclosed embodiments a pipe (inner) diameter for the plurality of heat transfer pipe segments 155 may be between one (1) and four (4) millimeters.

Further, as illustrated in FIG. 3, a result of the capillary action is the formation of liquid slugs 205 and vapor bubbles 210 within the plurality of heat transfer pipe segments 155. The liquid slugs 205 and vapor bubbles 210 are alternatively distributed along the plurality of heat transfer pipe segments 155 due to action of capillary force on the liquid-vapor interfaces. Two primary components of heat transfer in the system 100 is evaporation and condensation that respectively occur in one zone 220 and another zone 230 of the system 100. The one zone 220 is an evaporation zone of the oscillating heat pipe that includes the fluid passages 150 in the base plate 130 and a section of the plurality of heat transfer pipe segments 155 close to the base plate 130. The other zone 230 is a condensation zone that includes a section of the plurality of heat transfer pipe segments 155 further away from the base plate 130.

Heat transferred from the base plate 130 into the liquid slugs 205 in the plurality of heat transfer pipe segments 155 is absorbed as latent heat at liquid-vapor interfaces in the one zone 220, e.g., the evaporation zone. Due to evaporation, pressure rises in the plurality of heat transfer pipe segments 155. The rise in pressure pushes the liquid slugs 205 and vapor bubbles 210 to a lower-pressure area in the plurality of heat transfer pipe segments 155, which is in the other zone 230, e.g., the condensation zone. In the other zone 230, vapor condenses back to liquid. The condensing action releases latent heat to an environment 235, for example with an air flow 240 that is exterior to the plurality of heat transfer pipe segments 155. This interaction results in the liquid slugs 205 and vapor bubbles 210 oscillating and circulating inside the plurality of heat transfer pipe segments 155, which enhances heat transfer during evaporation and condensation cycles. With this configuration, the plurality of heat transfer pipe segments form oscillating heat pipes (OHP).

FIGS. 4a and 4b show an embodiment that includes a plurality of plate fins 250 secured to the plurality of heat transfer pipe segments 155 in the other zone 230, e.g., the condensation zone. In these figures the one of the plurality of heat transfer pipe segments 155a is again identified for reference. The plate fins 250 are parallel one another, parallel to the base plate 130, and staggered along the plurality of the plurality of heat transfer pipe segments 155. The plurality of plate fins 250 increase the heat transfer surface area exterior to the plurality of the plurality of heat transfer pipe segments 155 and improve the system thermal performance. In one embodiment, porous media 260 such as a metallic or carbon foam or other foam can be replace the plurality of plate fins 250 or be utilized in addition to the plurality of plate fins 250 to increase heat transfer area. The porous media 260, when used in place of the plurality of plate fins 250, may be a lighter weight alternative to the plurality of plate fins 250.

Figure 5A:
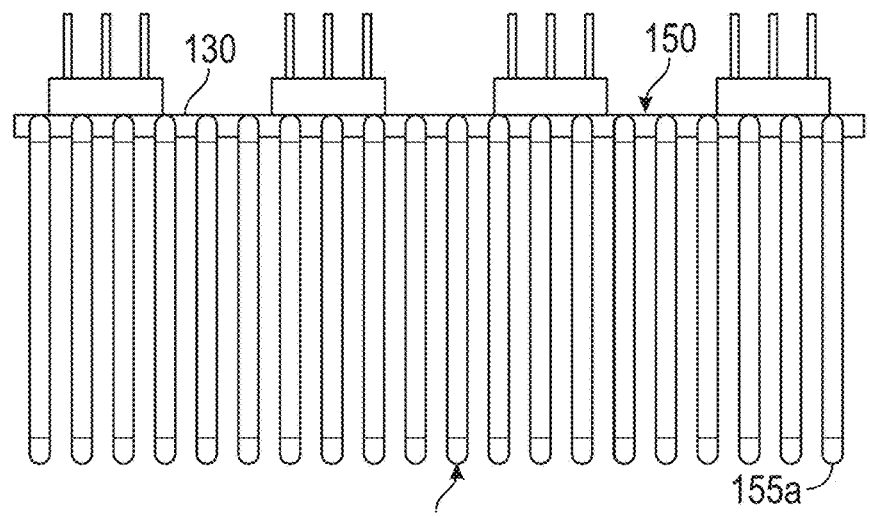
FIG. 5a shows a side view of the thermal management system of FIG. 1, wherein the plurality of heat transfer pipe segments are each closed loops.
Figure 5B:
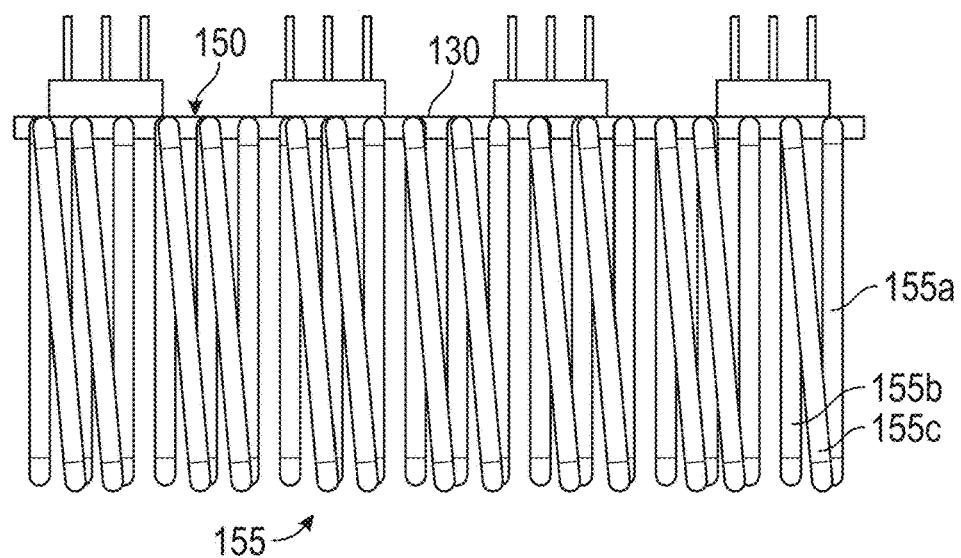
FIG. 5b shows a side view of a thermal management system where a plurality of sets of the plurality of heat transfer pipe segments are interconnected to form a plurality of closed loops.
Figure 5C:
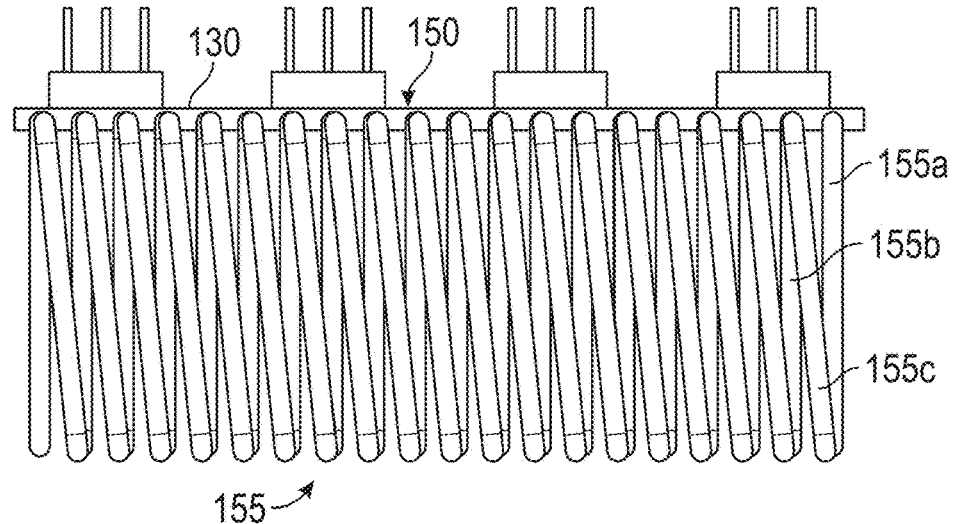
FIG. 5c shows a side view of a thermal management system where the plurality of heat transfer pipe segments are interconnected to form a single closed loop.

FIGS. 5a-5c show a side view of three different configurations for the plurality of heat transfer pipe segments 155. In these figures the one of the plurality of heat transfer pipe segments 155a is again identified for reference. In FIG. 5a, each of the plurality of heat transfer pipe segments 155 forms a closed-loop. This is the same configuration as identified in FIGS. 1-4. This configuration has relatively high robustness and reliability because the system 100 maintains a high thermal performance when one or more of the plurality of heat transfer pipe segments 155 degrades or fails.

In FIG. 5b, at least two of the plurality of heat transfer pipe segments 155 are fluidly connected to form a closed-loop. For example the one of the plurality of heat transfer pipe segments 155a is connected to another of the plurality of heat transfer pipe segments 155b. In FIG. 5c all of the plurality of heat transfer pipe segments 155 are fluidly connected to form a closed-loop. In FIG. 5c, the other of the plurality of heat transfer pipe segments 155b is again identified for reference. In FIGS. 5b and 5c, as an example, a leg 155c of the one of the plurality of heat transfer pipe segments 155a may extend adjacently to the other of the plurality of heat transfer pipe segments 155b to form the fluid connection. As indicated the one of the plurality of heat transfer pipe segments 155a and the other of the plurality of heat transfer pipe segments 155b are perpendicular to the base plate 130. Thus the leg 155c of the one of the plurality of heat transfer pipe segments 155a is at an angle to the base plate 130.

The advantages of the embodiments in FIGS. 5b and 5c include that heat transfer is maximized across the plurality of heat transfer pipe segments 155. Such configuration is suited for non-uniform source heat loads. Each of the configurations illustrated in FIGS. 5a-5c may be manufactured by traditional or additive manufacturing processes.

Figure 6:
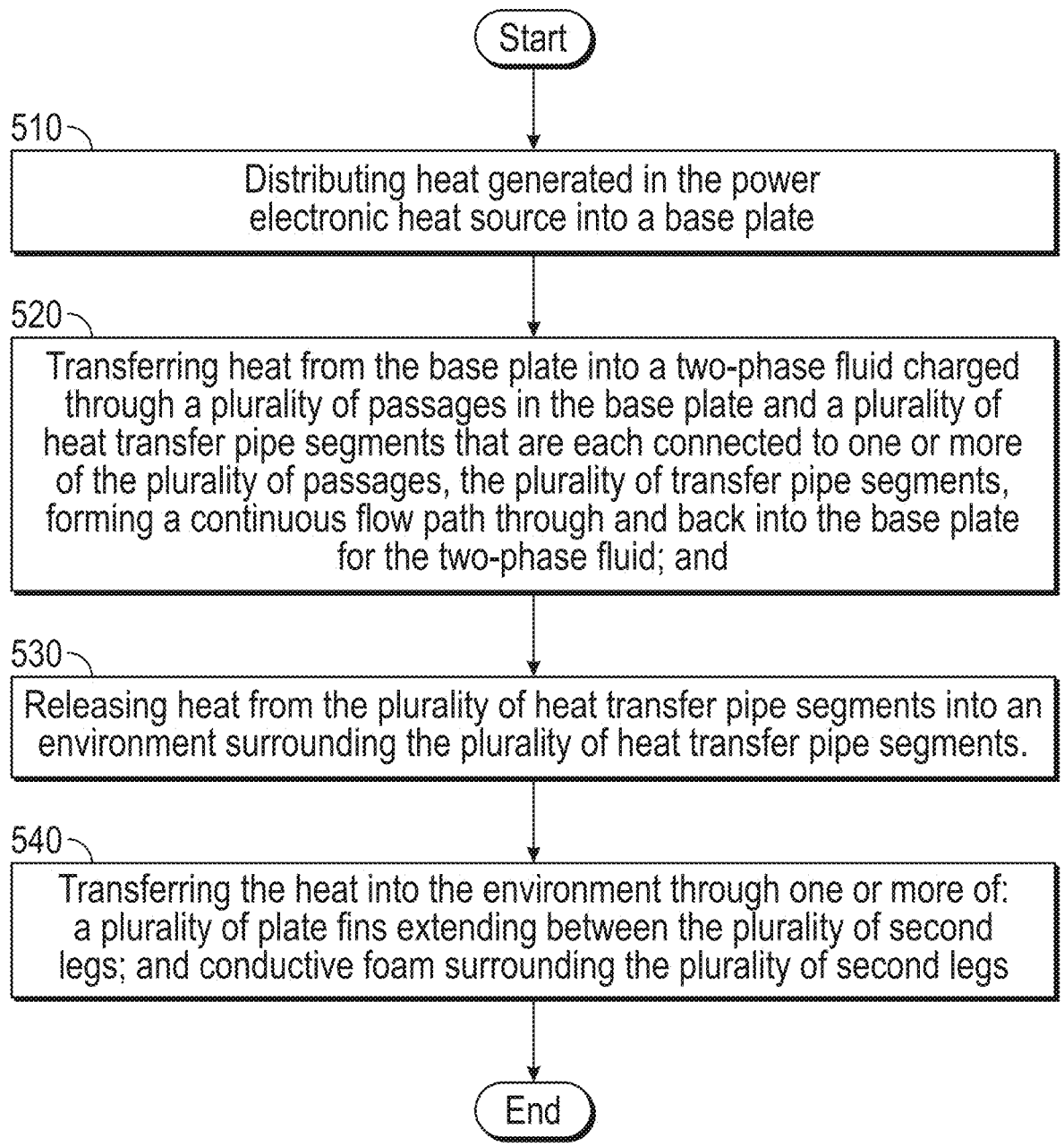
FIG. 6 is a flowchart showing a method of removing heat through the thermal management system of FIG. 1.

Turning to FIG. 6, a method is disclosed of removing heat from the power electronics heat sources 110 with the system 100. As shown in block 510 the method includes distributing heat generated in the power electronics heat source 110 into the base plate 130. As shown in block 520 the method includes transferring heat from the base plate 130 into the two-phase working fluid 200 charged in the plurality of heat transfer pipe segments 155 that are each connected to one or more of the plurality of fluid passages 150. As indicated in block 530, the method includes releasing heat from the plurality of heat transfer pipe segments 155 into an environment 235 surrounding the plurality of heat transfer pipe segments 155.

As indicated in block 540, the method includes transferring heat from the plurality of heat transfer pipe segments 155 into the environment through one or more of the plurality of plate fins 250 extending between the plurality of heat transfer pipe segments 155, and porous media 260 surrounding the plurality of heat transfer pipe segments 155.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

In comparison with the traditional thermal management and packaging method for modular power electronics devices, this invention disclosure will significantly reduce thermal spreading resistances, volume and weight of power electronics system and increase system power density while maintaining or/and improving its thermal management performance. In addition, the high flexibility of the OHP condenser configuration and location provides a robust design and packaging solution for applications with space constrain and cooling source restriction because the condenser potion can be remote and fit where the space is available. It's could be an ideal thermal management candidate for current high or extra high-power level power electronic devices such as megawatt driver development for hybrid aircraft propulsion applications.

Those of skill in the art will appreciate that various example embodiments are shown and described herein, each having certain features in the particular embodiments, but the present disclosure is not thus limited. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. A thermal management system for removing heat from a power electronic heat source, the system comprising:
    a base plate having a plurality of fluid passages there through and extending between an inlet side of the base plate and an outlet side of the base plate; and
    a plurality of heat transfer pipe segments respectively attached to one or more of the plurality of fluid passages at the inlet side of the base plate and the outlet side of the base plate, the plurality of heat transfer pipe segments arranged adjacent one another,
    the plurality of heat transfer pipe segments containing a two-phase working fluid, and
    the plurality of heat transfer pipe segments forming a continuous flow path through and back into the base plate for the two-phase working fluid;
    wherein the plurality of heat transfer pipe segments form respective serpentine channels extending perpendicularly to the fluid passges.

2. The system of claim 1, wherein the plurality of heat transfer pipe segments extend perpendicularly to the base plate.

3. The system of claim 1, wherein each of the plurality of heat transfer pipe segments forms a closed-loop.

4. The system of claim 1, wherein at least two of the plurality of heat transfer pipe segments are fluidly connected to form a closed-loop.

5. The system of claim 1, wherein all of the plurality of heat transfer pipe segments are fluidly connected to form a closed-loop.

6. The system of claim 1, wherein the two-phase working fluid is one of water, alcohol, methanol, or ammonia.

7. The system of claim 1, wherein the plurality of heat transfer pipe segments have a diameter of between 1-4 mm.

8. The system of claim 1, wherein the base plate is copper or aluminum, or titanium, or alloys.

9. The system of claim 1, comprising a plurality of plate fins extending between the plurality of heat transfer pipe segments.

10. The system of claim 1, comprising a porous media extending between the plurality of heat transfer pipe segments.

11. The system of claim 1, wherein when transferring heat, the two-phase working fluid defines alternating liquid slugs and vapor bubbles that oscillate inside the plurality of heat transfer pipe segments, thereby forming oscillating heat pipes (OHP).

12. The system of claim 11, wherein when transferring heat, one zone of the plurality of heat transfer pipe segments closest the base plate defines an evaporation zone of the oscillating heat pipe and another zone of the plurality of heat transfer pipe segments further from the base plate defines a condensation zone for the oscillating heat pipe.

13. An assembly including a power electronics heat source and the system of claim 1 connected to the power electronics heat source.

14. The assembly of claim 13, wherein the power electronic heat source includes at least one electronic device connected to the base plate.

15. The assembly of claim 13, comprising a plurality of electronic devices arranged in a grid pattern on the base plate.

16. The assembly of claim 14, wherein the at least one electronic device includes an IGBT chip or a MOSFET chip.

* * * * *